(12) United States Patent
Cho et al.

(10) Patent No.: US 12,514,061 B2
(45) Date of Patent: Dec. 30, 2025

(54) DISPLAY DEVICE

(71) Applicant: LG Display Co., Ltd., Seoul (KR)

(72) Inventors: Namwook Cho, Paju-si (KR); EuiTae Kim, Paju-si (KR); Kiseob Shin, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 115 days.

(21) Appl. No.: 17/125,115

(22) Filed: Dec. 17, 2020

(65) Prior Publication Data

US 2021/0202588 A1     Jul. 1, 2021

(30) Foreign Application Priority Data

Dec. 31, 2019  (KR) .................. 10-2019-0179467

(51) Int. Cl.
*H10K 59/121* (2023.01)
*H10K 59/122* (2023.01)
(Continued)

(52) U.S. Cl.
CPC ....... *H10K 59/121* (2023.02); *H10K 59/1213* (2023.02); *H10K 59/352* (2023.02);
(Continued)

(58) Field of Classification Search
CPC ............. H01L 27/3202; H01L 27/3216; H01L 27/3262; H01L 27/3276; H01L 27/326; H01L 27/3225; H01L 27/3227; H01L 27/3234; H01L 27/3211; H01L 27/3204; H01L 27/3213; H10K 59/84; H10K 59/352; H10K 59/1213; H10K 59/131;
(Continued)

(56) References Cited

U.S. PATENT DOCUMENTS 8,896,642 B2   11/2014  Yamamoto et al.
9,490,311 B2   11/2016  Park et al.
(Continued)

FOREIGN PATENT DOCUMENTS

CN   102194854 A   9/2011
CN   106856204 A   6/2017
(Continued)

OTHER PUBLICATIONS

Intellectual Property Office of the United Kingdom, Office Action, GB Patent Application No. 2020422.8, Jun. 16, 2021, eight pages.
(Continued)

*Primary Examiner* — Joshua Benitez Rosario
*Assistant Examiner* — John Lin
(74) *Attorney, Agent, or Firm* — Fenwick & West LLP

(57) ABSTRACT

A display device is disclosed, which may display an image even in an area overlapped with a camera and have high light transmittance. The display device comprises a substrate provided with a display area including a first display area and a second display area, a first transistor provided in the first display area over the substrate, a second transistor provided in the second display area over the substrate, a first subpixel supplied with a power source from the first transistor, and a second subpixel supplied with a power source from the second transistor. At least two or more second subpixels share one second transistor.

13 Claims, 13 Drawing Sheets

(51) Int. Cl.
  *H10K 59/35*    (2023.01)
  *H10K 59/84*    (2023.01)
  *H10K 59/131*   (2023.01)
  *H10K 59/38*    (2023.01)
  *H10K 59/65*    (2023.01)
  *H10K 59/80*    (2023.01)

(52) U.S. Cl.
  CPC ........... *H10K 59/84* (2023.02); *H10K 59/122* (2023.02); *H10K 59/131* (2023.02); *H10K 59/38* (2023.02); *H10K 59/65* (2023.02); *H10K 59/8791* (2023.02)

(58) Field of Classification Search
  CPC ...... H10K 59/121; H10K 59/60; H10K 59/65; H10K 59/35; H10K 59/86; H10K 59/351; H10K 59/353; H10K 59/128; H10K 59/12; H10K 59/123; H10K 59/1315; H10K 2102/3031; H10K 50/813; H10K 50/814; H10K 50/816; H10K 50/818; H10L 39/34
  See application file for complete search history.

(56) References Cited

U.S. PATENT DOCUMENTS

| | | | |
|---|---|---|---|
| 9,847,486 | B2 | 12/2017 | Park et al. |
| 10,044,002 | B2 | 8/2018 | Lee et al. |
| 10,186,191 | B2 | 1/2019 | Kang et al. |
| 10,482,811 | B2 | 11/2019 | Kang et al. |
| 10,510,813 | B2 | 12/2019 | Son et al. |
| 10,515,268 | B2 | 12/2019 | Zhou |
| 10,535,290 | B2 | 1/2020 | Choi et al. |
| 10,861,371 | B2 | 12/2020 | Choi et al. |
| 10,930,233 | B1 | 2/2021 | Huang et al. |
| 11,082,547 | B2 | 8/2021 | Xu et al. |
| 11,288,999 | B2 | 3/2022 | Choi et al. |
| 11,527,592 | B2 | 12/2022 | Shan et al. |
| 11,568,785 | B2 | 1/2023 | Choi et al. |
| 2011/0220899 | A1 | 9/2011 | Park et al. |
| 2015/0129856 | A1* | 5/2015 | Kim ..................... H10K 59/353 257/40 |
| 2017/0077404 | A1 | 3/2017 | Park et al. |
| 2017/0162111 | A1 | 6/2017 | Kang et al. |
| 2017/0193876 | A1 | 7/2017 | Choi et al. |
| 2018/0062107 | A1* | 3/2018 | Kim ..................... H10K 59/131 |
| 2018/0190735 | A1 | 7/2018 | Son et al. |
| 2019/0122608 | A1 | 4/2019 | Kang et al. |
| 2019/0130822 | A1 | 5/2019 | Jung et al. |
| 2019/0214595 | A1 | 7/2019 | Park |
| 2019/0214596 | A1 | 7/2019 | Park |
| 2020/0051497 | A1 | 2/2020 | Kang et al. |
| 2020/0118477 | A1 | 4/2020 | Choi et al. |
| 2020/0195764 | A1 | 6/2020 | Xu et al. |
| 2020/0394964 | A1* | 12/2020 | Hyun ..................... G09G 3/3208 |
| 2021/0056884 | A1 | 2/2021 | Choi et al. |
| 2021/0217821 | A1* | 7/2021 | Han ..................... H01L 51/001 |
| 2021/0359053 | A1 | 11/2021 | Shan et al. |
| 2022/0180792 | A1 | 6/2022 | Choi et al. |

FOREIGN PATENT DOCUMENTS

| | | | |
|---|---|---|---|
| CN | 106935619 | A | 7/2017 |
| CN | 107025875 | A | 8/2017 |
| CN | 107632443 | A | 1/2018 |
| CN | 107819023 | A | 3/2018 |
| CN | 108254954 | A | 7/2018 |
| CN | 109192076 | A | 1/2019 |
| CN | 109584794 | A | 4/2019 |
| CN | 109671733 | A | 4/2019 |
| CN | 110112176 | A | 8/2019 |
| CN | 110444125 | A | 11/2019 |
| CN | 110543050 | A | 12/2019 |
| EP | 3624434 | A1 | 3/2020 |
| KR | 10-2019-0085202 | A | 7/2019 |
| WO | WO 2019/006749 | A1 | 1/2019 |
| WO | WO 2019/062158 | A1 | 4/2019 |

OTHER PUBLICATIONS

Intellectual Property India, Office Action, IN Patent Application No. 202014053167, Jan. 3, 2022, five pages.
The German Patent and Trademark Office, Office Action, DE Patent Application No. 10 2020 133 363.3, Jan. 26, 2023, 15 pages.
Intellectual Property office of the United Kingdom, Office Action, GB Patent Application No. 2219142.3, Apr. 24, 2023, six pages.
China National Intellectual Property Administration, Office Action, Chinese Patent Application No. 202011534319.4, Nov. 3, 2023, 16 pages.
Intellectual Property Office of the United Kingdom, Examination Report, United Kingdom Patent Application No. GB2219142.3, Nov. 2, 2023, four pages.
Intellectual Property Office of the United Kingdom, Examination Report, United Kingdom Patent Application No. GB2219142.3, Mar. 1, 2024, five pages.

* cited by examiner

DISPLAY DEVICE

CROSS-REFERENCE TO RELATED APPLICATION

This application claims priority to Republic of Korea Patent Application No. 10-2019-0179467 filed on Dec. 31, 2019, in the Korean Intellectual Property Office, the disclosure of which is incorporated by reference in its entirety.

BACKGROUND

Technical Field

The present disclosure relates to a display device, and more particularly, to a display device in which a camera is embedded.

Description of the Related Art

A display device includes various display elements such as a liquid crystal display element or an organic light emitting display element in a display area. The display device includes a camera embedded therein, and therefore a method for applying various applications by interacting the display area with the camera has been devised.

In the display device, a camera hole may be provided to arrange the camera and then the camera may be disposed in the camera hole. In this case, since an image is not displayed in an area where the camera hole is formed, an image displayed in the display device may be disconnected and may be recognized by a user.

SUMMARY

The present disclosure has been made in view of the above problems, and it is an object of the present disclosure to provide a display device that may display an image even in an area overlapped with a camera and have high light transmittance.

In addition to the objects of the present disclosure as mentioned above, additional objects and features of the present disclosure will be clearly understood by those skilled in the art from the following description of the present disclosure.

In accordance with an aspect of the present disclosure, the above and other objects can be accomplished by the provision of a display device comprising a substrate provided with a display area including a first display area and a second display area, a first transistor provided in the first display area on the substrate, a second transistor provided in the second display area on the substrate, a first subpixel supplied with a power source from the first transistor, and a second subpixel supplied with a power source from the second transistor, where at least two or more second subpixels share one second transistor.

In accordance with another aspect of the present disclosure, the above and other objects can be accomplished by the provision of a display device comprising a display panel including a first display area and a second display area, and a camera disposed below the display panel and provided to overlap the second display area, wherein the second display area includes a plurality of transmissive areas, and a non-transmissive area provided between the transmissive areas and provided with a light emission area.

According to the present disclosure, the first display area having light transmittance different from that of the second display area may be provided, and the transmissive area may be provided in the second display area. An optical module may be disposed to be overlapped with the second display area, whereby external light may enter an optical module through the transmissive area.

Also, according to the present disclosure, at least two or more subpixels share one transistor in the second display area, whereby an area where the transistor is formed may be reduced. Therefore, in the present disclosure, light transmittance in the second display area may be improved.

Also, according to the present disclosure, a circuit element and a plurality of signal lines are not provided in the transmissive area of the second display area, whereby light transmittance in the transmissive area may be improved.

Also, according to the present disclosure, a ratio among a first color subpixel, a second color subpixel and a third color subpixel may equally be maintained in a first unit pixel area and a second unit pixel area. Therefore, when an image is displayed in both the first display area and the second display area, a color difference between the first display area and the second display area may not occur.

In addition to the effects of the present disclosure as mentioned above, additional advantages and features of the present disclosure will be clearly understood by those skilled in the art from the above description of the present disclosure.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION

Figure 1:
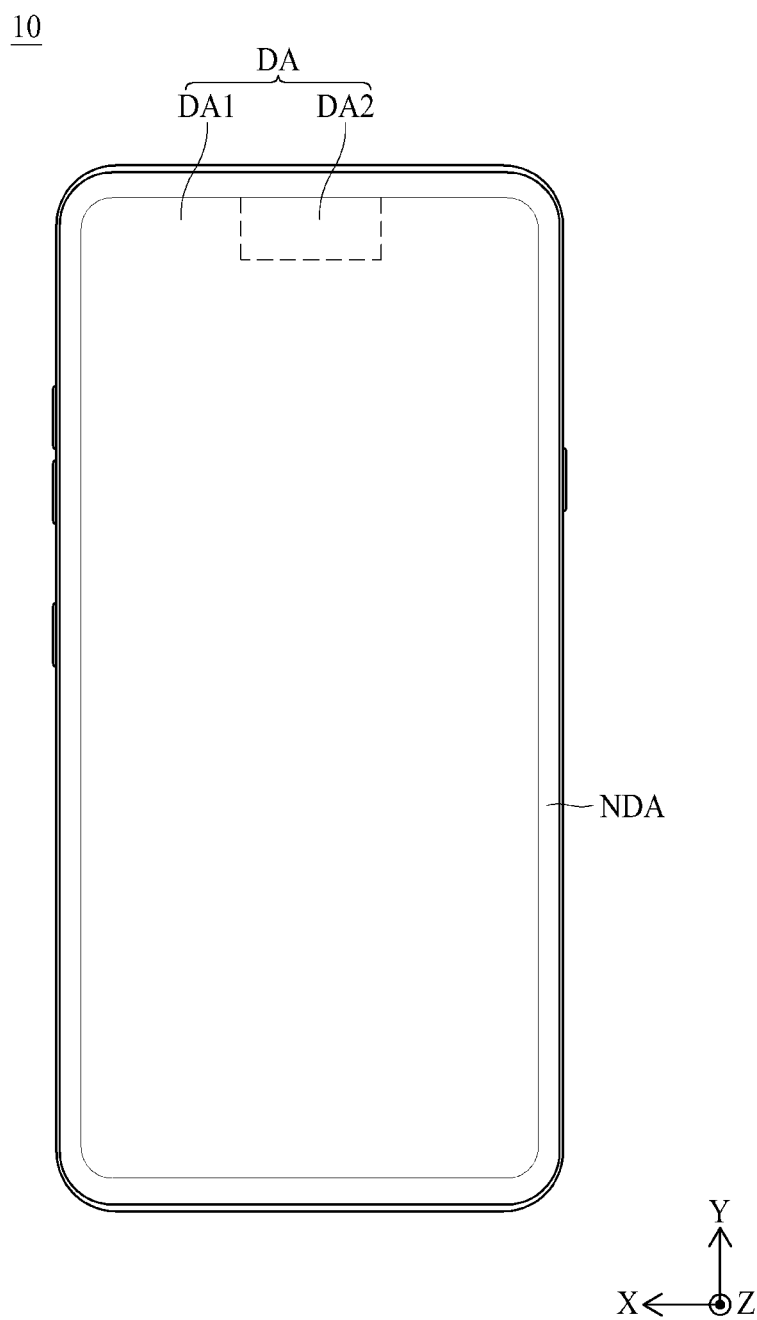
FIG. 1 is a schematic plane view illustrating a display device according to one embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~', 'above~', 'below~', and 'next to~', one or more portions may be arranged between two other portions unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, an electronic apparatus according to the present disclosure will be described in detail with reference to the accompanying drawings. Wherever possible, the same reference numbers will be used throughout the drawings to refer to the same or like parts.

Figure 2:
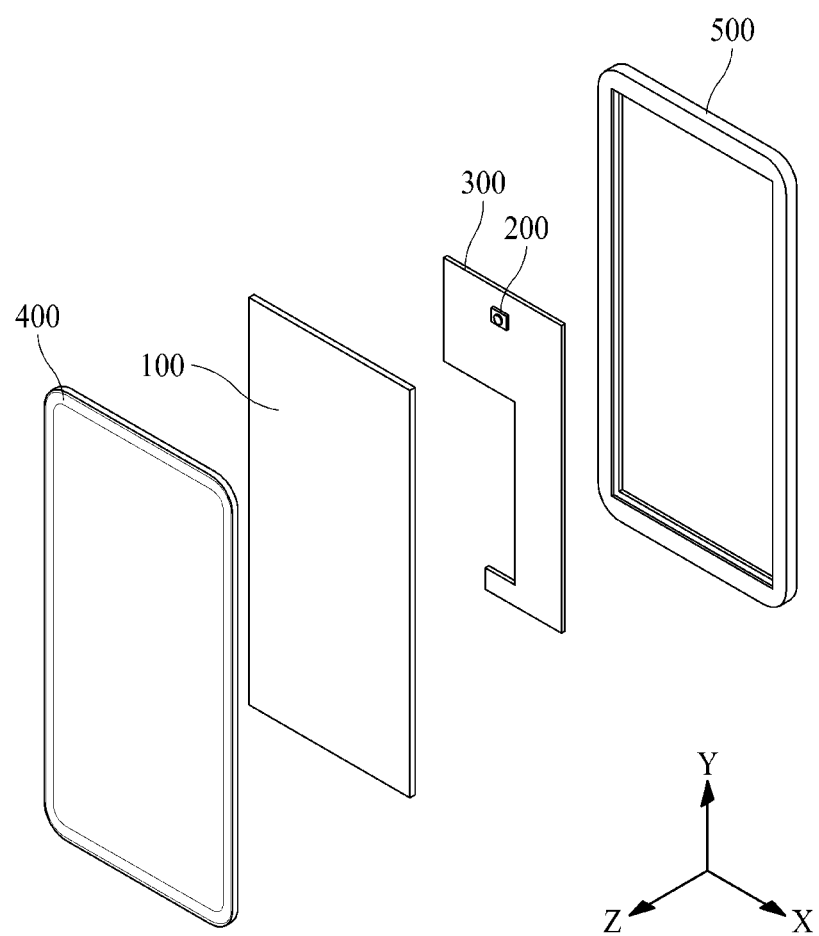
FIG. 2 is a schematic exploded view illustrating a display device according to one embodiment of the present disclosure.

FIG. 1 is a schematic plane view illustrating a display device according to one embodiment of the present disclosure, and FIG. 2 is a schematic exploded view illustrating a display device according to one embodiment of the present disclosure.

Referring to FIGS. 1 and 2, the display device 10 according to one embodiment of the present disclosure may include a display panel 100, an optical module 200, a circuit board 300, a cover window 400, and a frame 500.

The display panel 100 may include light emitting diodes for displaying an image through a display surface. The display panel 100 may be categorized into a display area DA where pixels are formed to display an image, and a non-display area NDA where an image is not displayed. The display area DA may comprise a first display area DA1 and a second display area DA2.

The non-display area NDA may be disposed to surround the display area DA. A driver for supplying various signals to a plurality of signal lines in the display area DA and a link portion for connecting the driver with the plurality of signal lines may be formed in the non-display area NDA. The driver may include a gate driver for supplying a gate signal to a gate line and a data driver for supplying a data signal to a data line.

Although a description has been described based on that the display panel 100 is embodied as an organic light emitting display panel, the display panel 100 may be embodied as a liquid crystal display panel, a plasma display panel (PDP), a quantum dot light emitting display (QLED) panel, or an electrophoresis display panel.

The optical module 200 may be disposed over a rear surface of the display panel 100. The optical module 200 may be provided to overlap the display area DA of the display panel 100, particularly the second display area DA2. The optical module 200 may mean all elements that use external light input through the display panel 100. For example, the optical module 200 may be, but not limited to, a camera. The optical module 200 may be an illumination sensor, a fingerprint sensor, etc.

The circuit board 300 may be disposed over the rear surface of the display panel 100. The circuit board 300 may be a printed circuit board (PCB) or a flexible printed circuit board (FPCB).

The cover window 400 may be disposed over the front surface of the display panel 100. The cover window 400 may serve to protect the display panel 100 from external impact by covering the front surface of the display panel 100.

The cover window 400 may be made of a transparent plastic material, a glass material, or a reinforcing glass material. As an example, the cover window 400 may have one or a deposited structure of sapphire glass and gorilla glass. As another example, the cover window 400 may include any one of polyethyleneterephthalate (PET), polycarbonate (PC), polyethersulfone (PES), polyethylenapthanate (PEN), and polynorborneen (PNB). The cover window 400 may be made of reinforcing glass in consideration of scratch and transparency.

The frame 500 may store the display panel 100 and support the cover window 400. Also, the frame 500 may include an accommodating portion that may accommodate the optical module 200 and the circuit board 300. The frame 500 may serve to fix the display panel 100, the optical module 200 and the circuit board 300 to the display device 10. Also, the frame 500 may serve to protect the display panel 100, the optical module 200 and the circuit board 300 from impact.

In this case, the frame 500 may be, but not limited to, a middle frame or a housing.

Hereinafter, the subpixels disposed in the first display area DA1 and the second display area DA2 of the display panel 100 will be described in more detail.

Figure 3:
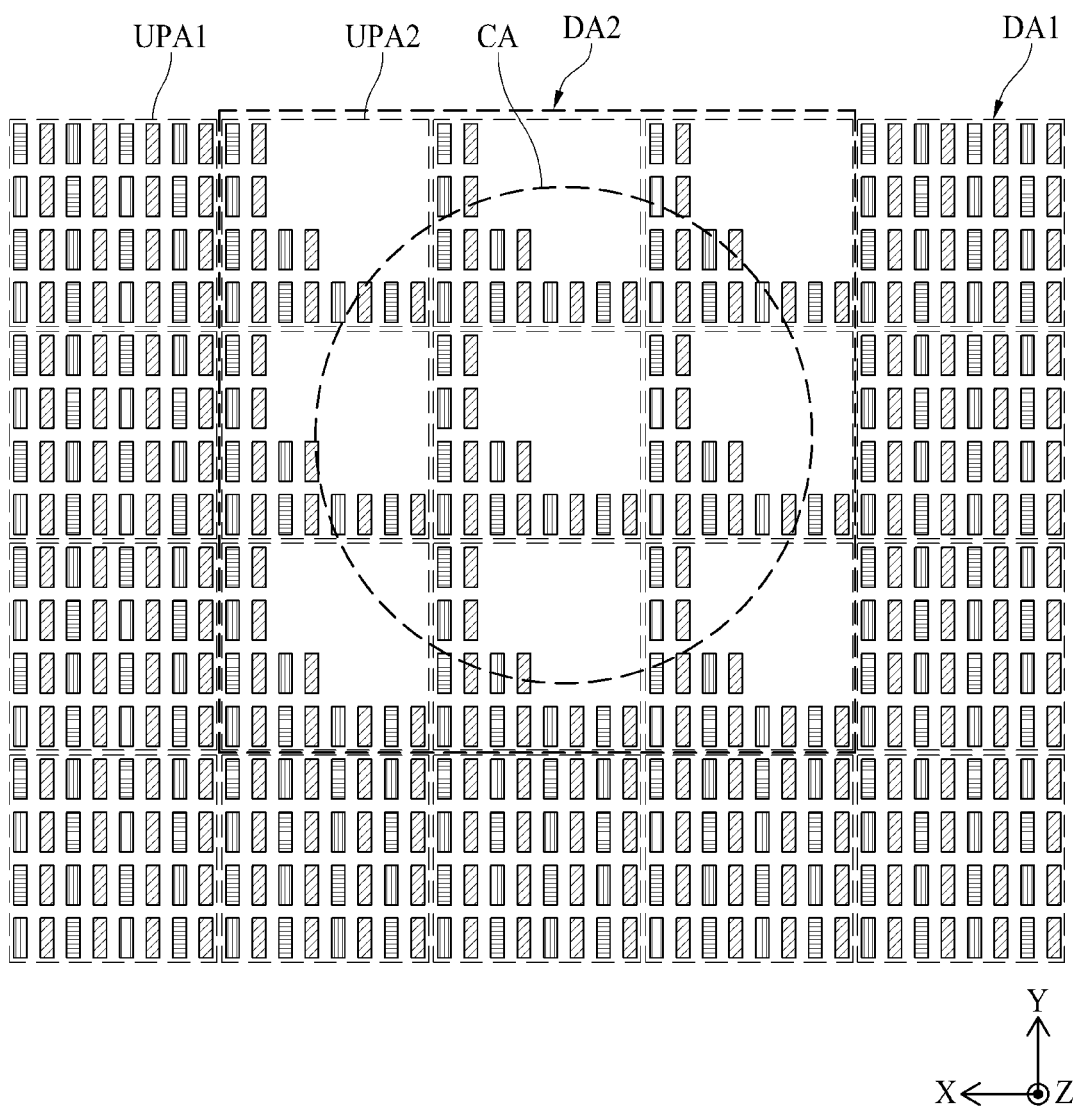
FIG. 3 is a plane view illustrating subpixels disposed in a display panel according to one embodiment of the present disclosure.

FIG. 3 is a plane view illustrating subpixels disposed in a display panel according to one embodiment of the present disclosure.

Referring to FIG. 3, the display panel 100 includes a first display area DA1 comprised of a plurality of first unit pixel areas UPA1 and a second display area DA2 comprised of a plurality of second unit pixel areas UPA2.

The first display area DA1 is an area where an image is displayed, regardless of an operation of the optical module 200, and may be provided with a wide area.

The second display area DA2 may be disposed to overlap an area CA where the optical module 200 is disposed, and whether to display an image may be determined depending on the operation of the optical module 200. In detail, the second display area DA2 may display an image together with the first display area DA1 if the optical module 200 is not operated. On the other hand, the second display area DA2 may not display an image if the optical module 200 is operated. At this time, an image may be displayed on the first display area DA1.

A size and a position of the second display area DA2 may be determined in consideration of the optical module 200. The second display area DA2 may be provided at a position corresponding to the optical module 200. The second display area DA2 may be provided at a size that includes the area CA where the optical module 200 is disposed.

Hereinafter, the first display area DA1 will be described in more detail with reference to FIGS. 4 and 5.

Figure 4:
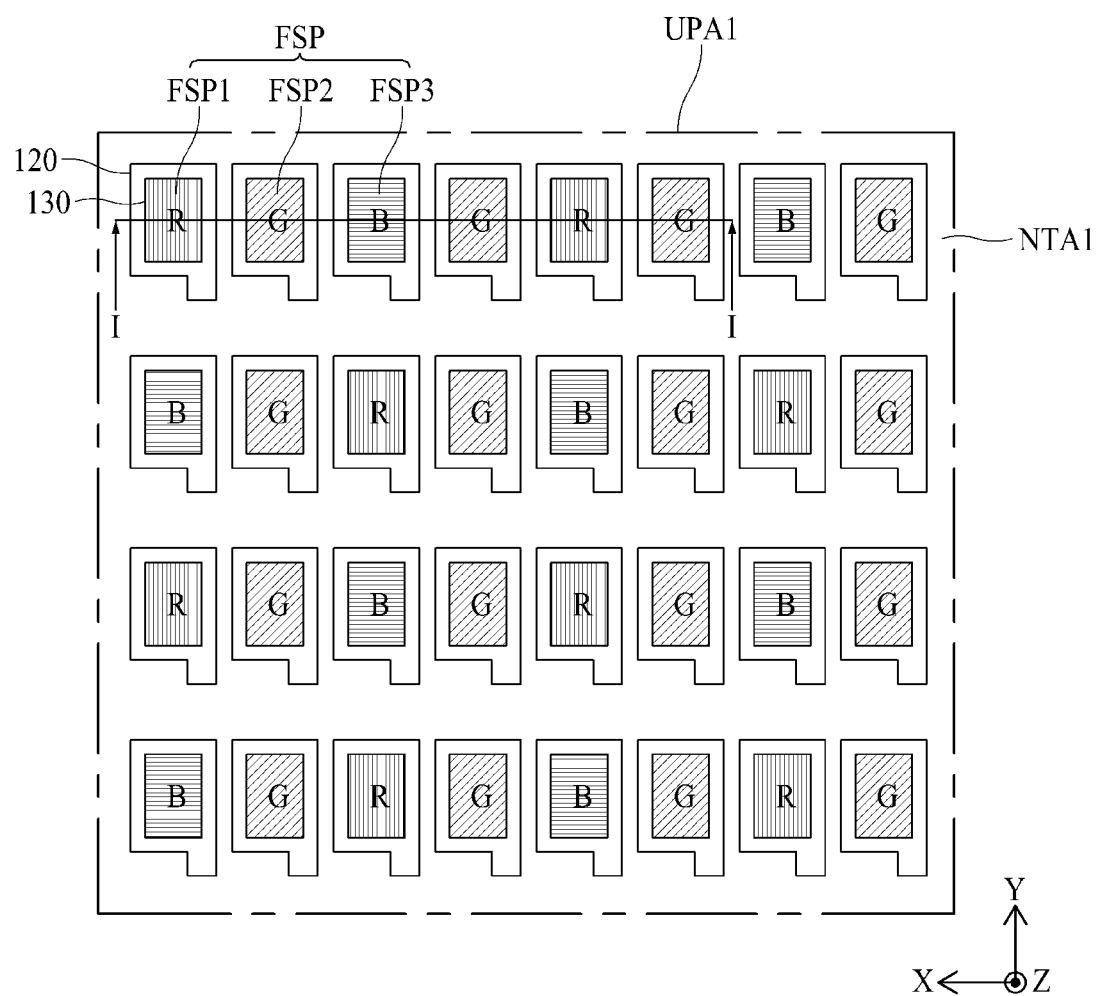
FIG. 4 is a schematic plane view illustrating an anode electrode and an organic light emitting layer of first subpixels disposed in a first unit pixel area of FIG. 3 according to one embodiment of the present disclosure.
Figure 5:
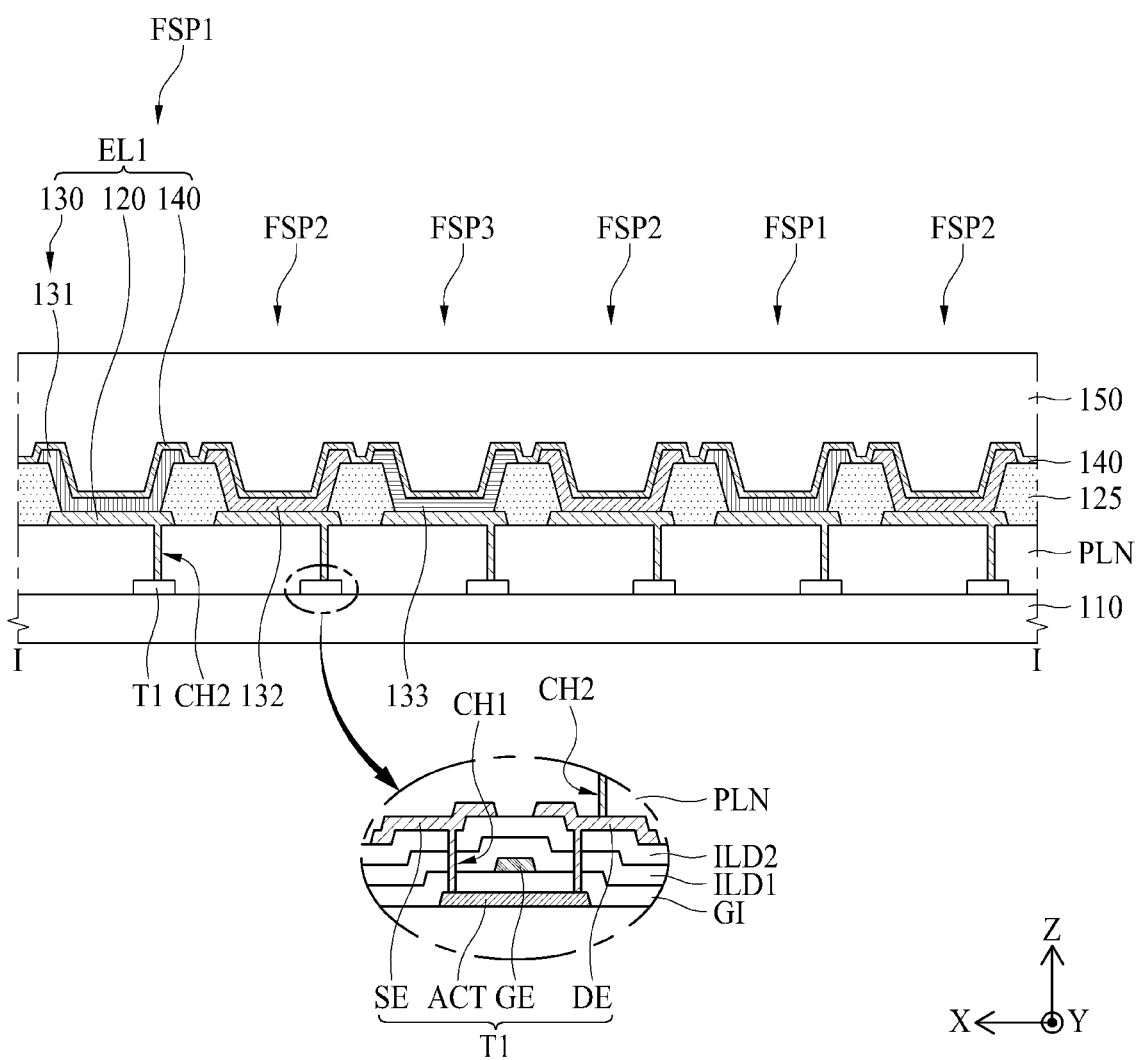
FIG. 5 is a cross-sectional view taken along line I-I of FIG. 4 according to one embodiment of the present disclosure.

FIG. 4 is a schematic plane view illustrating an anode electrode and an organic light emitting layer of first subpixels disposed in a first unit pixel area of FIG. 3, and FIG. 5 is a cross-sectional view taken along line I-I of FIG. 4.

Referring to FIGS. 3, 4 and 5, the first display area DA1 may include a plurality of first unit pixel areas UPA1. Each of the plurality of first unit pixel areas UPA1 may include a first non-transmissive area NTA1. The first non-transmissive area NTA1 is an area where most of externally incident light is not transmitted.

The first non-transmissive area NTA1 of the substrate 110 may be provided with a plurality of first pixels. Each of the plurality of first pixels may include a plurality of first subpixels FSP. The plurality of first subpixels FSP may include a first color subpixel FSP1, a second color subpixel FSP2, and a third color subpixel FSP3. The first color subpixel FSP1 may emit red light, the second color subpixel FSP2 may emit green light, and the third color subpixel FSP3 may emit blue light, but these color subpixels are not limited thereto. An arrangement sequence of the first subpixels FSP may be varied in various ways without limitation to FIGS. 3 and 4.

Hereinafter, for convenience of description, a description will be given based on that the first color subpixel FSP1 is a red subpixel emitting red light, the second color subpixel FSP2 is a green subpixel emitting green light, and the third color subpixel FSP3 is a blue subpixel emitting blue light.

Each of the plurality of first subpixels FSP may include a first transistor T1 and a first light emitting diode EL1.

The first transistor T1 may be provided in each of the plurality of first subpixels FSP. That is, the first subpixel FSP and the first transistor T1 may correspond to each other one to one in the first unit pixel area UPA1.

The first transistor T1 includes an active layer ACT, a gate electrode GE, a source electrode SE, and a drain electrode DE.

In detail, the active layer ACT may be provided over the first substrate 110. The active layer ACT may be formed of a silicon based semiconductor material or an oxide based semiconductor material. A buffer film (not shown) may be provided between the active layer ACT and the first substrate 110.

A gate insulating film GI may be provided over the active layer ACT. The gate insulating film GI may be formed of an inorganic film, for example, a silicon oxide (SiOx) film, a silicon nitride (SiNx) film, or a multi-layered film of SiOx and SiNx.

A gate electrode GE may be provided over the gate insulating film GI. The gate electrode GE may be formed of a single layer or a multi-layer made of any one of molybdenum (Mo), aluminum (Al), chromium (Cr), gold (Au), titanium (Ti), nickel (Ni), neodymium (Nd) and copper (Cu) or their alloy.

A first inter-layer dielectric film ILD1 and a second inter-layer dielectric film ILD2 may be provided over the gate electrode GE. The first inter-layer dielectric film ILD1 and the second inter-layer dielectric film ILD2 may be formed of an inorganic film, for example, a silicon oxide (SiOx) film, a silicon nitride (SiNx) film, or a multi-layered film of SiOx and SiNx.

The source and drain electrodes SE and DE may be provided over the second inter-layer dielectric film ILD2. The source and drain electrodes SE and DE may be connected to the active layer ACT through a first contact hole CH1 that passes through the gate insulating film GI and the first and second inter-layer dielectric films ILD1 and ILD2.

The source and drain electrodes SE and DE may be formed of a single layer or a multi-layer made of any one of Mo, Al, Cr, Au, Ti, Ni, Nd and Cu or their alloy.

A planarization film PLN may be provided over the source electrode SE and drain electrode DE to planarize a step difference caused by the transistor T1. The planarization film PLN may be formed of an organic film, for example, acryl based material, epoxy based material, phenolic based material, polyamide based material, polyimide based material, etc.

A first light emitting diode EL1 comprised of an anode electrode 120, an organic light emitting layer 130 and a cathode electrode 140, and a bank 125 may be provided over the planarization film PLN.

The anode electrode 120 may be provided per the first subpixel FSP. The anode electrode 120 may be provided over the planarization film PLN and connected with the first transistor T1. In detail, the anode electrode 120 may be connected to one of the source and drain electrodes SE and DE through a second contact hole CH2 that passes through the planarization film PLN. For example, the anode electrode 120 may be connected to the drain electrode DE through the second contact hole CH2 that passes through the planarization film PLN.

The anode electrode 120 may be formed of a metal material of high reflectance such as a deposited structure (Ti/Al/Ti) of aluminum and titanium, a deposited structure (ITO/Al/ITO) of aluminum and ITO, an Ag alloy and a deposited structure (ITO/Ag alloy/ITO) of Ag alloy and ITO. The Ag alloy may be an alloy of silver (Ag), palladium (Pb), and Copper (Cu).

The bank 125 may be provided over the planarization film PLN. Also, the bank 125 may be provided between the anode electrodes 120. At this time, the bank 125 may be provided to cover edges of the anode electrodes 120 and partially expose the anode electrodes 120. Therefore, the bank 125 may reduce light emitting efficiency deterioration due to a current concentrated on the ends of the anode electrodes 120.

The bank 125 may define a light emission area of each of the first subpixels FSP. The area where the bank 125 is not provided and the anode electrode 120 is exposed may be the light emission area, and the other area may be a non-light emission area.

The bank 125 may be formed of an organic film, for example, acryl based material, epoxy based material, phenolic based material, polyamide based material, polyimide based material, etc.

The organic light emitting layer 130 may be provided over the anode electrode 120. The organic light emitting layer 130 may include a hole transporting layer, a light emitting layer, and an electron transporting layer. In this case, if a voltage is applied to the anode electrode 120 and the cathode electrode 140, holes and electrons move to the light emitting layer through the hole transporting layer and the electron transporting layer, respectively, and are combined with each other in the light emitting layer to emit light.

The organic light emitting layer 130, as shown in FIG. 5, may include light emitting layers, each of which is provided for each of the first subpixels FSP. For example, a red light emitting layer 131 emitting red light may be provided in the first color subpixel FSP1, a green light emitting layer 132 emitting green light may be provided in the second color subpixel FSP2, and a blue light emitting layer 133 emitting blue light may be provided in the third color subpixel FSP3.

The cathode electrode 140 may be provided over the organic light emitting layer 130 and the bank 125. The cathode electrode 140 may be a common layer commonly provided for the first subpixels FSP to apply the same voltage to the first subpixels. The cathode electrode 140 may be provided of a transparent conductive material (TCO) such as ITO and IZO, which can transmit light, or may be formed of a semi-transmissive conductive material such as magnesium (Mg), silver (Ag), or alloy of Mg and Ag. If the cathode electrode 140 is formed of a semi-transmissive conductive material, emission efficiency may be enhanced by micro cavity.

An encapsulation film 150 may further be provided over the first light emitting diode EL. The encapsulation film 150 may be provided over the cathode electrode 140 to overlay the cathode electrode 140. The encapsulation film 150 serves to reduce the likelihood of oxygen or water from permeating into the organic light emitting layer 130 and the cathode electrode 140. To this end, the encapsulation film 150 may include at least one inorganic film and at least one organic film.

Meanwhile, although not shown in FIG. 5, a capping layer may additionally be provided between the cathode electrode 140 and the encapsulation film 150.

Hereinafter, the second display area DA2 will be described in more detail with reference to FIGS. 6 to 11.

Figure 6:
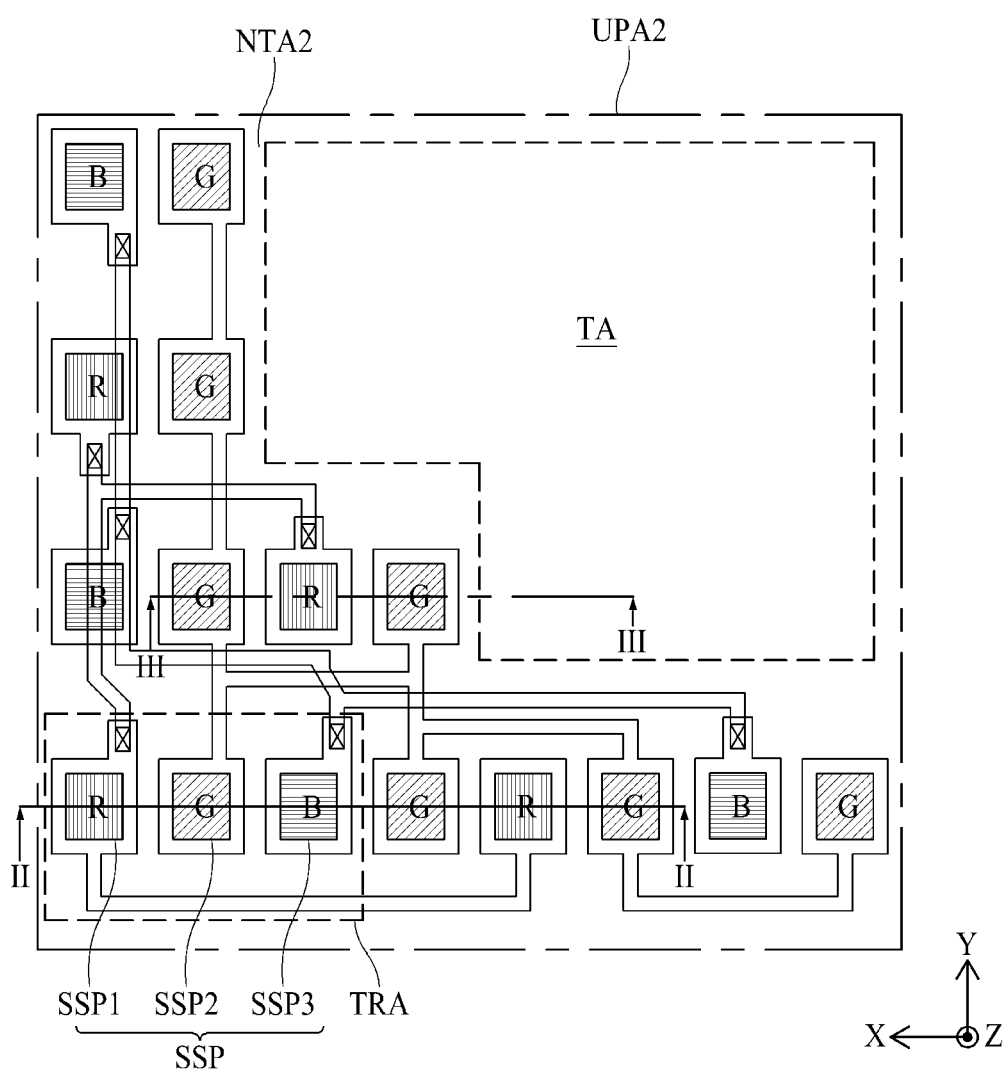
FIG. 6 is a plane view illustrating an anode electrode and an organic light emitting layer of second subpixels disposed in a second unit pixel area of FIG. 3 according to one embodiment of the present disclosure.
Figure 7:
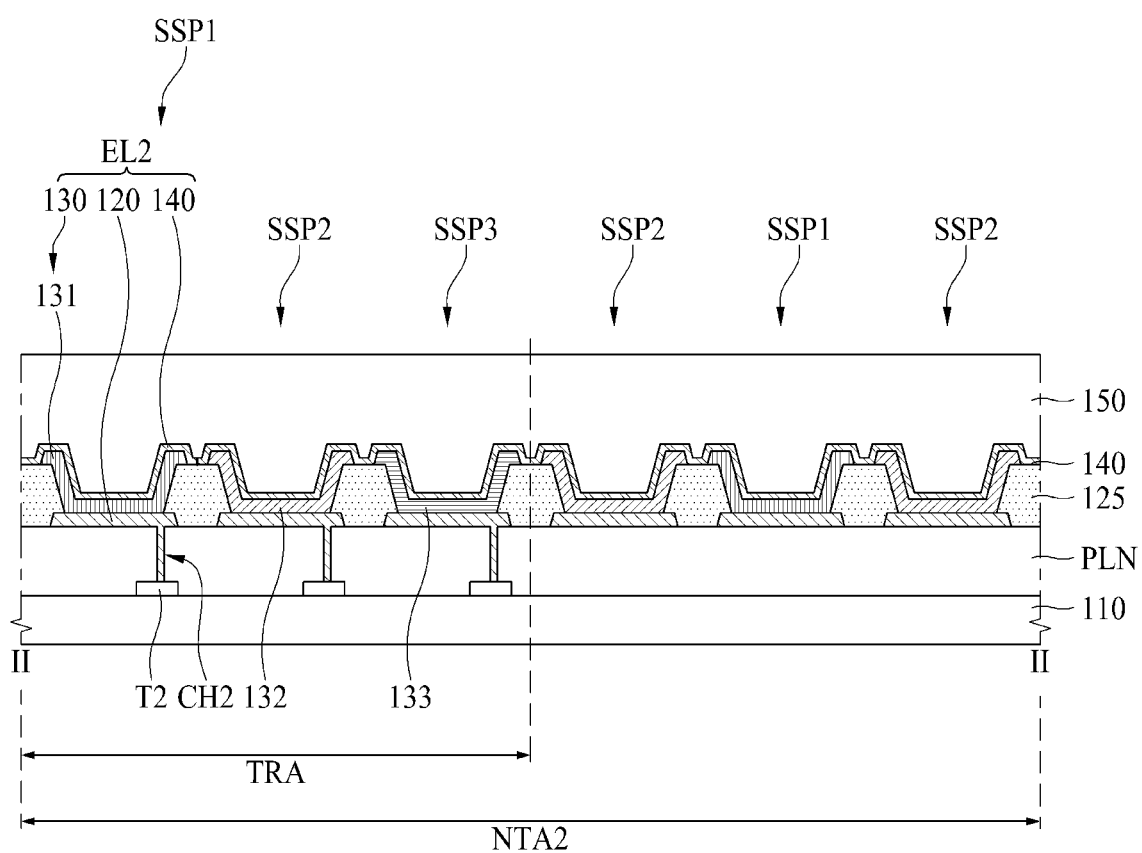
FIG. 7 is a cross-sectional view taken along line II-II of FIG. 6 according to one embodiment of the present disclosure.
Figure 8:
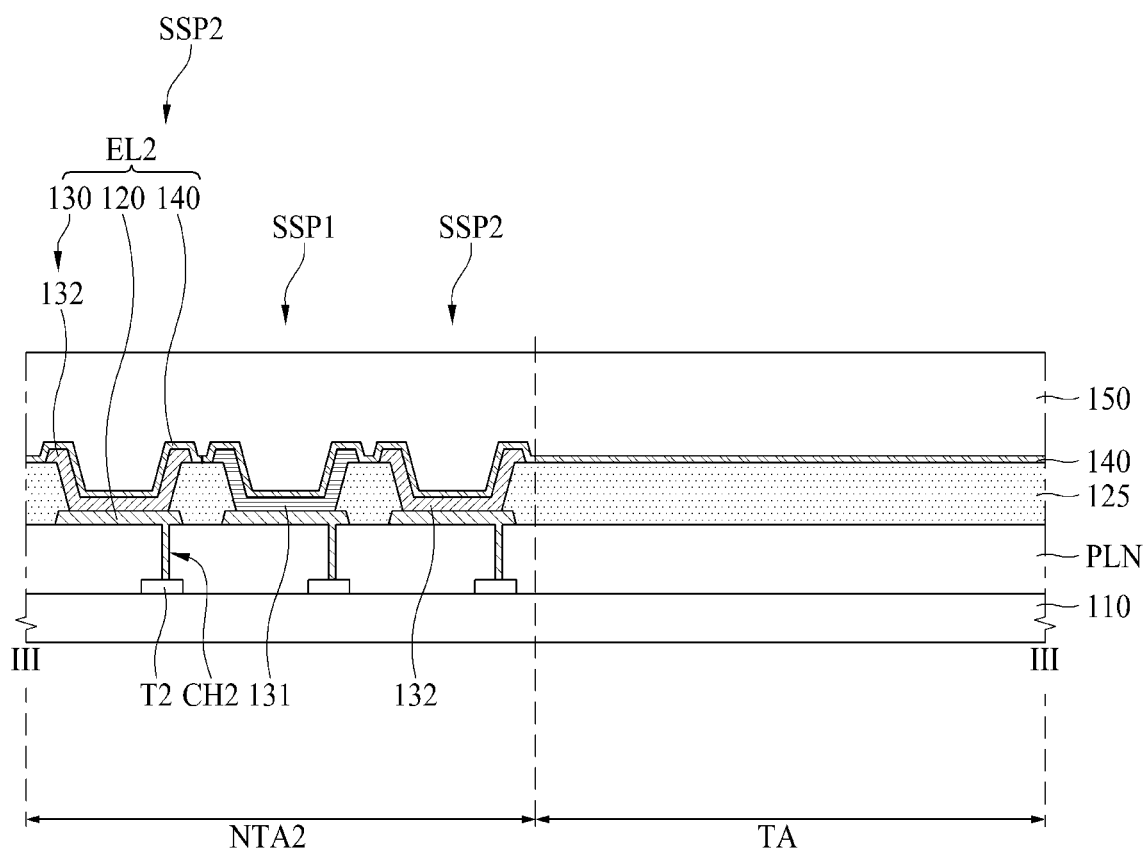
FIG. 8 is a cross-sectional view taken along line III-III of FIG. 6 according to one embodiment of the present disclosure.
Figure 9:
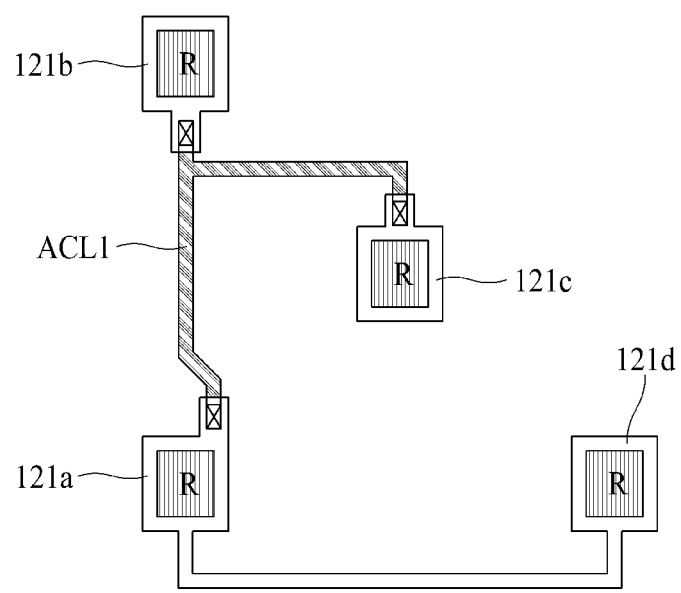
FIG. 9 is a view illustrating an anode electrode of a first color subpixel provided in a second unit pixel area according to one embodiment of the present disclosure.
Figure 10:
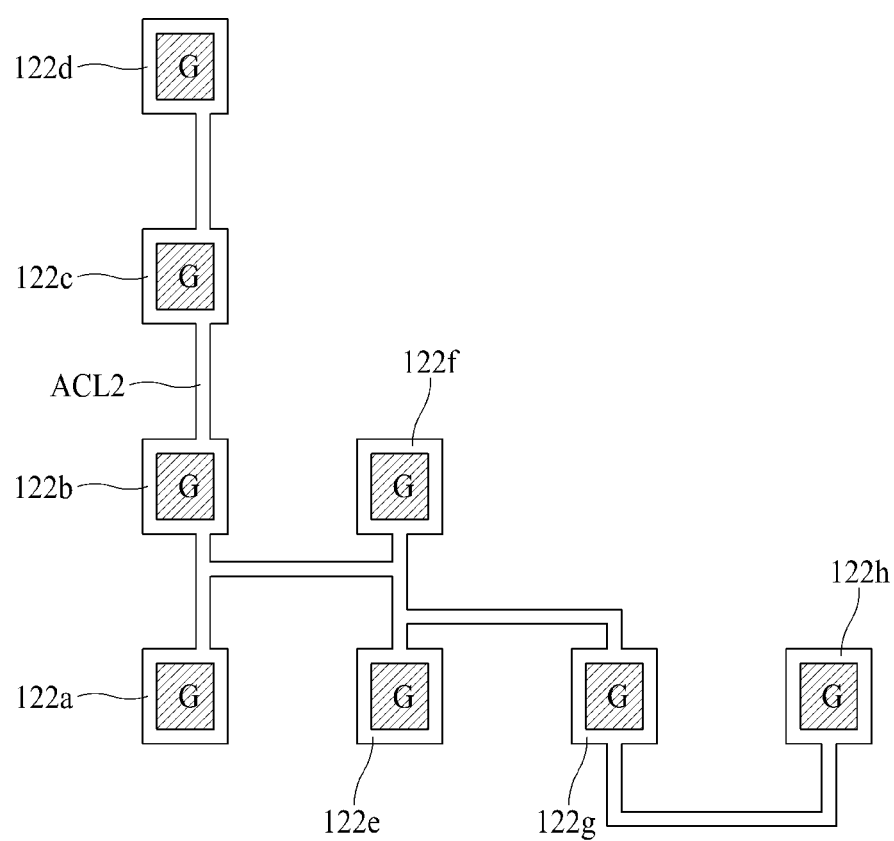
FIG. 10 is a view illustrating an anode electrode of a second color subpixel provided in a second unit pixel area according to one embodiment of the present disclosure.
Figure 11:
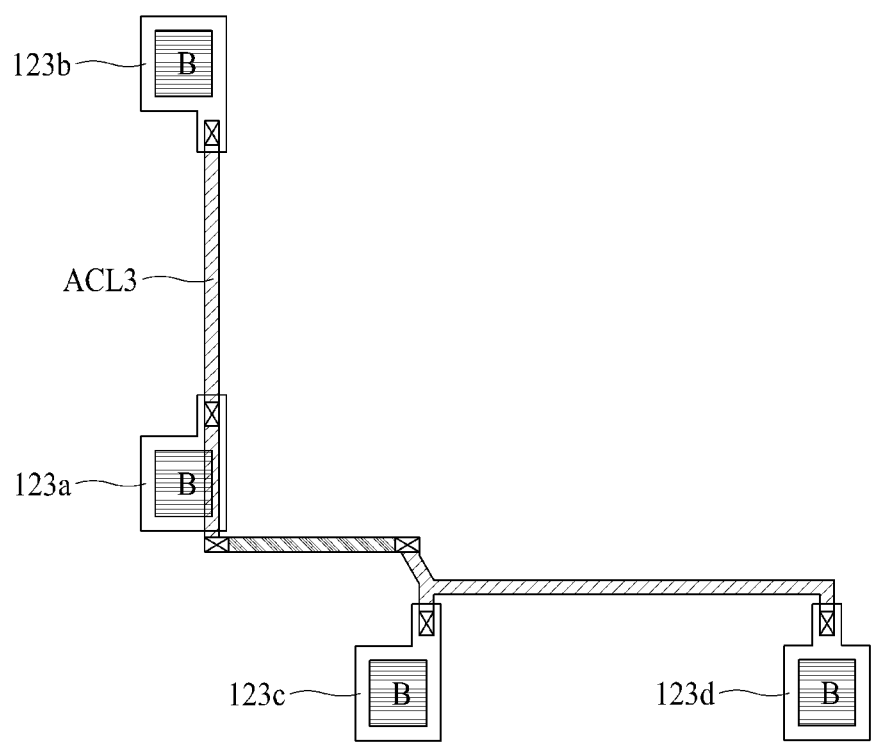
FIG. 11 is a view illustrating an anode electrode of a third color subpixel provided in a second unit pixel area according to one embodiment of the present disclosure.

FIG. 6 is an enlarged view illustrating an anode electrode and an organic light emitting layer of second subpixels disposed in a second unit pixel area of FIG. 3, FIG. 7 is a cross-sectional view taken along line II-II of FIG. 6, FIG. 8 is a cross-sectional view taken along line III-III of FIG. 6, FIG. 9 is a view illustrating an anode electrode of a first color subpixel provided in a second unit pixel area, FIG. 10 is a view illustrating an anode electrode of a second color subpixel provided in a second unit pixel area, and FIG. 11 is a view illustrating an anode electrode of a third color subpixel provided in a second unit pixel area.

Referring to FIGS. 6 to 11, the second display area DA2 may include a plurality of second unit pixel areas UPA2. Each of the plurality of second unit pixel areas UPA2 may have the same shape and the same size as those of the first unit pixel area UPA1 disposed in the first display area DA1. For example, the second unit pixel area UPA2 may have a rectangular shape, and may have a size such that eight subpixels may be provided in a first direction (X axis direction) and four subpixels may be provided in a second direction (Y axis direction). In this case, in the same manner as the second unit pixel area UPA2, the first unit pixel area UPA1 may have a rectangular shape, and may have a size such that eight subpixels may be provided in a first direction (X axis direction) and four subpixels may be provided in a second direction (Y axis direction).

The second unit pixel area UPA2 may include a transmissive area TA and a second non-transmissive area NTA2. The transmissive area TA is an area where most of incident light is transmitted, and the second non-transmissive area NTA2 is an area where most of incident light is not transmitted. For example, the transmissive area is an area where light transmittance is $\alpha$%, for example, greater than 90%, and the second non-transmissive area NTA2 is an area where light transmittance is $\beta$%, for example, smaller than 50%. At this time, $\alpha$ is a value greater than $\beta$. External light may enter the optical module 200 disposed over the rear surface of the display panel 100, through the transmissive areas TA.

The second non-transmissive area NTA2 of the second unit pixel area UPA2 may be provided with a plurality of second pixels. Each of the plurality of second pixels may include a plurality of second subpixels SSP. The plurality of second subpixels SSP may include a first color subpixel SSP1, a second color subpixel SSP2, and a third color subpixel SSP3. The first color subpixel SSP1 may emit red light, the second color subpixel SSP2 may emit green light, and the third color subpixel SSP3 may emit blue light, but these color subpixels are not limited thereto. An arrangement sequence of the second subpixels SSP may be varied in various ways without limitation to FIGS. 3 and 6.

Hereinafter, for convenience of description, a description will be given based on that the first color subpixel SSP1 is a red subpixel emitting red light, the second color subpixel SSP2 is a green subpixel emitting green light, and the third color subpixel SSP3 is a blue subpixel emitting blue light.

Each of the plurality of second subpixels SSP may include a second transistor T2 and a second light emitting diode EL2. Since the second transistor T2 of the second subpixel SSP is substantially the same as the first transistor T1 of the first subpixel FSP in its elements, its detailed description will be omitted. Since the second light emitting diode EL2 of the second subpixel SSP is substantially the same as the first light emitting diode EL1 of the first subpixel FSP in its elements, its detailed description will be omitted. Hereinafter, only differences will be described in detail.

Since the second unit pixel area UPA2 is provided with the transmissive area TA, the second non-transmissive area NTA2 may be formed to be smaller than the first non-transmissive area NTA1 provided in the first unit pixel area UPA1. Therefore, the number of the second subpixels SSP provided in the second unit pixel area UPA2 may be smaller than the number of the first subpixels FSP provided in the first unit pixel area UPA1.

For example, a total of sixteen second subpixels SSP of four red subpixels SSP1, eight green subpixels SSP2 and four blue subpixels SSP3 may be provided in the second unit pixel area UPA2. Meanwhile, a total of thirty-two first subpixels FSP of eight red subpixels FSP1, sixteen green subpixels FSP2 and eight blue subpixels FSP3 may be provided in the first unit pixel area UPA1. That is, the second subpixels SSP equivalent to a half of the number of the first subpixels FSP provided in the first unit pixel area UPA1 may be provided in the second unit pixel area UPA2.

Light transmittance of the second display area DA2 may be varied depending on the number of the second subpixels SSP provided in the second unit pixel area UPA2. If the number of the second subpixels SSP provided in the second unit pixel area UPA2 is increased, luminance and resolution of the second display area DA2 may be enhanced but light transmittance of the second display area DA2 may be reduced. Meanwhile, if the number of the second subpixels SSP provided in the second unit pixel area UPA2 is reduced, luminance and resolution of the second display area DA2 may be reduced but light transmittance of the second display area DA2 may be enhanced. In the display panel 110 according to one embodiment of the present disclosure, the number of the second subpixels SSP may be determined in consideration of luminance, resolution and light transmittance of the second display area DA2.

As described above, different number of subpixels FSP and SSP may be provided in the first unit pixel area UPA1 and the second unit pixel area UPA2 but a ratio among the first color subpixels FSP1 and SSP1, the second color subpixels FSP2 and SSP2 and the third color subpixels FSP3 and SSP3 may equally be maintained.

For example, the first unit pixel area UPA1 may include eight red subpixels FSP1, sixteen green subpixels FSP2 and eight blue subpixels FSP3. That is, the first unit pixel area UPA1 may be provided with the first color subpixel FSP1, the second color subpixel FSP2 and the third color subpixel FSP3 at a ratio of 1:2:1.

Also, the second unit pixel area UPA2 may include four red subpixels SSP1, eight green subpixels SSP2 and four blue subpixels SSP3. That is, the second unit pixel area UPA2 may be provided with the first color subpixel SSP1, the second color subpixel SSP2 and the third color subpixel SSP3 at a ratio of 1:2:1.

The display panel 100 according to one embodiment of the present disclosure may equally maintain the ratios among the first color subpixels FSP1 and SSP1, the second color subpixels FSP2 and SSP2 and the third color subpixels FSP3 and SSP3 in the first unit pixel area UPA1 and the second unit pixel area UPA2. Therefore, the display panel 100 according to one embodiment of the present disclosure may allow a color difference between the first display area DA1 and the second display area DA2 not to be generated when an image is displayed on both the first display area DA1 and the second display area DA2.

Although the second unit pixel area UPA2 includes the second non-transmissive area NTA2 like the first unit pixel area UPA1, light transmittance of the second non-transmissive area NTA2 may be different from that of the first non-transmissive area NTA1 of the first unit pixel area UPA1.

In detail, the second non-transmissive area NTA2 of the second unit pixel area UPA2 may be provided with the second transistor T2 and the plurality of second subpixels SSP. At least two or more second subpixels SSP of the plurality of second subpixels SSP may share one second transistor T2. At this time, at least two or more second subpixels SSP that share one second transistor T2 may be subpixels emitting the same color.

One second transistor T2 may share at least two or more first color subpixels SSP1 provided in the second unit pixel area UPA2. Another one second transistor T2 may share at least two or more second color subpixels SSP2 provided in the second unit pixel area UPA2. Still another one second transistor T2 may share at least two or more third color subpixels SSP3 provided in the second unit pixel area UPA2. Therefore, a transistor area TRA where the second transistor T2 is provided may be provided in some of the second non-transmissive area NTA2.

For example, one second transistor T2 may share four red subpixels SSP1 provided in the second unit pixel area UPA2. Another second transistor T2 may share eight green subpixels SSP2 provided in the second unit pixel area UPA2. Still another second transistor T2 may share four blue subpixels SSP3 provided in the second unit pixel area UPA2.

In this case, a total of sixteen second subpixels SSP may be disposed in the second unit pixel area UPA2, or the second transistor T2 may be disposed to correspond to three second subpixels SSP of sixteen second subpixels SSP as shown in FIG. 7. Therefore, the transistor area TRA provided with the second transistor T2 may include only an area where three second subpixels SSP are provided.

The transistor area TRA may be provided with various circuit elements, such as a switching transistor and a sensing transistor, as well as the second transistor T2. Therefore, the transistor area TRA may have light transmittance different from that of the other area except the transistor area TRA of the second non-transmissive area NTA2.

The transistor area TRA of the second non-transmissive area NTA2 may have the same light transmittance as that of the first non-transmissive area NTA1. On the other hand, since various circuit elements including the second transistor T2 are not provided in the other area except the transistor area TRA of the second non-transmissive area NTA2, the other area may have light transmittance higher than that of the first non-transmissive area NTA1.

In the display panel 100 according to one embodiment of the present disclosure, at least two or more second subpixels SSP share one second transistor T2 in the second display area DA2, whereby light transmittance of the second display area DA2 may be improved.

Meanwhile, in the display panel 100 according to one embodiment of the present disclosure, the anode electrodes 120 of at least two or more second subpixels SSP that share one second transistor T2 may be electrically connected with one another.

In detail, at least two or more first color subpixels SSP1 of the plurality of first color subpixels SSP1 provided in the second unit pixel area UPA2 may share one transistor T2. Although FIGS. 6 and 9 show that all of the plurality of first color subpixels SSP1 provided in the second unit pixel area UPA2 share one transistor T2, the present disclosure is not limited to the examples of FIGS. 6 and 10. In another embodiment, at least two or more first color subpixels SSP1 of the plurality of first color subpixels SSP1 may share one transistor T2.

Each of at least two or more first color subpixels SSP1 that share one second transistor T2 may include a first anode electrode 121. The first anode electrodes 121 of the at least two or more first color subpixels SSP1, as shown in FIG. 9, may be electrically connected with one another. Therefore, the at least two or more first color subpixels SSP1 may simultaneously emit light.

At this time, the first anode electrodes 121 of the at least two or more first color subpixels SSP1 may be connected with one another using at least one first anode connection line ACL1. At least one first anode connection line ACL1 may be formed on the same layer as at least one layer of the gate electrode GE, the source electrode SE, the drain electrode DE and the anode electrode 120.

For example, four first color subpixels SSP1 provided in the second unit pixel area UPA2 may share one transistor T2. First anode electrodes 121a, 121b, 121c and 121d of the four first color subpixels SSP1 that share one transistor T2 may be electrically connected with one another. At this time, the first anode electrodes 121a, 121b, 121c and 121d of the four first color subpixels SSP1 may be electrically connected with one another through a plurality of first anode connection lines ACL1. Each of the plurality of first anode connection lines ACL1 may be formed on the same layer as at least one layer of the gate electrode GE, the source electrode SE, the drain electrode DE and the anode electrode 120.

The first anode electrode 121a of one first color subpixel SSP1 may be electrically connected with the first anode electrode 121b of another one first color subpixel SSP1 through the first anode connection line ACL1 provided on the same layer as the gate electrode GE. In this case, the first anode connection line ACL1 may be connected to the first anode electrode 121a of one first color subpixel SSP1 through one contact hole at one end, and may be connected to the first anode electrode 121b of another one first color subpixel SSP1 through another one contact hole at the other end.

Alternatively, the first anode electrode 121a of one first color subpixel SSP1 may be electrically connected with the first anode electrode 121d of another one first color subpixel SSP1 through the first anode connection line ACL1 extended from the first anode electrode 121a.

Although FIG. 9 shows that first anode electrodes 121a, 121b, 121c and 121d of four first color subpixels SSP1 are electrically connected with one another, the present disclosure is not limited to the example of FIG. 9. The plurality of first anode connection lines ACL1 may be provided on another layer not the gate electrode GE, for example, the same layer as the source electrode SE and the drain electrode DE.

Also, at least two or more second color subpixels SSP2 of the plurality of second color subpixels SSP2 provided in the second unit pixel area UPA2 may share one transistor T2. Although FIGS. 6 and 10 show that all of the plurality of second color subpixels SSP2 provided in the second unit pixel area UPA2 share one transistor T2, the present disclosure is not limited to the examples of FIGS. 6 and 10. In another embodiment, at least two or more second color subpixels SSP2 of the plurality of second color subpixels SSP2 may share one transistor T2.

Each of at least two or more second color subpixels SSP2 that share one second transistor T2 may include a second anode electrode 122. The second anode electrodes 122 of the at least two or more second color subpixels SSP2 may be electrically connected with one another as shown in FIG. 10. Therefore, the at least two or more second color subpixels SSP2 may simultaneously emit light.

At this time, the second anode electrodes 122 of the at least two or more second color subpixels SSP2 may be electrically connected with one another using at least one second anode connection line ACL2. At least one second anode connection line ACL2 may be formed on the same layer as at least one layer of the gate electrode GE, the source electrode SE, the drain electrode DE and the anode electrode 120.

For example, eight second color subpixels SSP2 provided in the second unit pixel area UPA2 may share one transistor T2. Second anode electrodes 122a, 122b, 122c, 122d, 122e, 122f, 122g and 122h of the eight second color subpixels SSP2 that share one transistor T2 may be electrically connected with one another. At this time, the second anode electrodes 122a, 122b, 122c, 122d, 122e, 122f, 122g, and 122h of the eight second color subpixels SSP2 may be electrically connected with one another through a plurality of second anode connection lines ACL2. Each of the plurality of second anode connection lines ACL2 may be formed on the same layer as at least one layer of the gate electrode GE, the source electrode SE, the drain electrode DE and the anode electrode 120.

The plurality of second anode connection lines ACL2 may be formed on the same layer as the second anode electrode 122. The second anode electrodes 122a of the second color subpixels SSP2 may be electrically connected with one another through the second anode connection line ACL2 formed on the same layer as the second anode electrode 122 as shown in FIG. 10 but are not limited thereto.

In another embodiment, the plurality of second anode connection lines ACL2 may be provided on another layer that is not the second anode electrode 122, for example, the same layer as the source electrode SE and the drain electrode DE.

Also, at least two or more third color subpixels SSP3 of a plurality of third color subpixels SSP2 provided in the second unit pixel area UPA2 may share one transistor T2. Although FIGS. 6 and 11 show that all of the plurality of third color subpixels SSP3 provided in the second unit pixel area UPA2 share one transistor T2, the present disclosure is not limited to the examples of FIGS. 6 and 11. In another embodiment, at least two or more third color subpixels SSP3 of the plurality of third color subpixels SSP3 may share one transistor T2.

Each of at least two or more third color subpixels SSP3 that share one second transistor T2 may include a third anode electrode 123. The third anode electrodes 123 of the at least two or more third color subpixels SSP3 may be electrically connected with one another as shown in FIG. 11. Therefore, the at least two or more third color subpixels SSP3 may simultaneously emit light.

At this time, the third anode electrodes 123 of the at least two or more third color subpixels SSP3 may be electrically connected with one another using at least one third anode connection line ACL3. At least one third anode connection line ACL3 may be formed on the same layer as at least one layer of the gate electrode GE, the source electrode SE, the drain electrode DE and the anode electrode 120.

For example, four third color subpixels SSP3 provided in the second unit pixel area UPA2 may share one transistor T2. Third anode electrodes 123a, 123b, 123c and 123d of four third color subpixels SSP3 that share one transistor T2 may be electrically connected with one another. At this time, the third anode electrodes 123*a*, 123*b*, 123*c* and 123*d* of the four third color subpixels SSP3 may be electrically connected with one another through a plurality of third anode connection lines ACL3. Each of the plurality of third anode connection lines ACL3 may be formed on the same layer as at least one layer of the gate electrode GE, the source electrode SE, the drain electrode DE and the anode electrode 120.

The third anode electrode 123*a* of one third color subpixel SSP3 may be electrically connected with the third anode electrode 123*b* of another one third color subpixel SSP3 through the third anode connection line ACL3 provided on the same layer as the source electrode SE and the drain electrode DE. In this case, the third anode connection line ACL3 may be connected to the third anode electrode 123*a* of one third color subpixel SSP3 through one contact hole at one end, and may be connected to the third anode electrode 123*b* of another one third color subpixel SSP3 through another one contact hole at the other end.

Alternatively, the third anode electrode 123*a* of one third color subpixel SSP3 may be electrically connected with the third anode electrode 123*c* of another one third color subpixel SSP3 through the third anode connection line ACL3 provided on the same layer as the gate electrode GE and the third anode connection line ACL3 provided on the same layer as the source electrode SE and the drain electrode DE.

Although FIG. 11 shows that third anode electrodes 123*a*, 123*b*, 123*c* and 123*d* of four third color subpixels SSP3 are electrically connected with one another, the present disclosure is not limited to the example of FIG. 11. The plurality of third anode connection lines ACL3 may be provided on another layer not the gate electrode GE, the source electrode SE and the drain electrode DE, for example, the same layer as the anode electrode 120.

Meanwhile, the second unit pixel area UPA2 includes the transmissive area TA unlike the first unit pixel area UPA1. The transmissive area TA of the second unit pixel area UPA2 is not provided with the second subpixel SSP as shown in FIG. 6. Moreover, the transmissive area TA of the second unit pixel area UPA2 is not provided with a plurality of signal lines supplying a signal to the second subpixel SSP. The plurality of signal lines supplying a signal to the second subpixel SSP may be provided in only the second non-transmissive area NTA2.

Consequently, the metal layer is not provided in the transmissive area TA of the second unit pixel area UPA2, and the inorganic insulating film or the organic insulating film may be provided therein. For example, the gate insulating film GI, the first inter-layer dielectric film ILD1, the second inter-layer dielectric film ILD2, the planarization film PLN, the bank 125 and the encapsulation film 150 may only be provided in the transmissive area TA of the second unit pixel area UPA2. Since each of the gate insulating film GI, the first inter-layer dielectric film ILD1, the second inter-layer dielectric film ILD2, the planarization film PLN, the bank 125 and the encapsulation film 150 is made of a transparent material, the second unit pixel area UPA2 may have high light transmittance in the transmissive area TA.

The display panel 100 according to one embodiment of the present disclosure may be provided with the first display area DA1 and the second display area DA2, each of which has its respective light transmittance. Since the first display area DA1 is not overlapped with the optical module 200, the first display area DA1 may have first low light transmittance. Since the second display area DA2 is overlapped with the optical module 200, the second display area DA2 may have second low light transmittance higher than the first light transmittance.

In the display panel 100 according to one embodiment of the present disclosure, since a plurality of second subpixels SSP are provided in the second display area DA2, an image may be displayed on the second display area DA2. Also, in the display panel 100 according to one embodiment of the present disclosure, the second display area DA2 includes the transmissive area TA. Therefore, external light may enter the optical module 200 disposed on the rear surface of the display panel 100 through the transmissive area TA provided in the second display area DA2 of the display panel 100.

Figure 12:
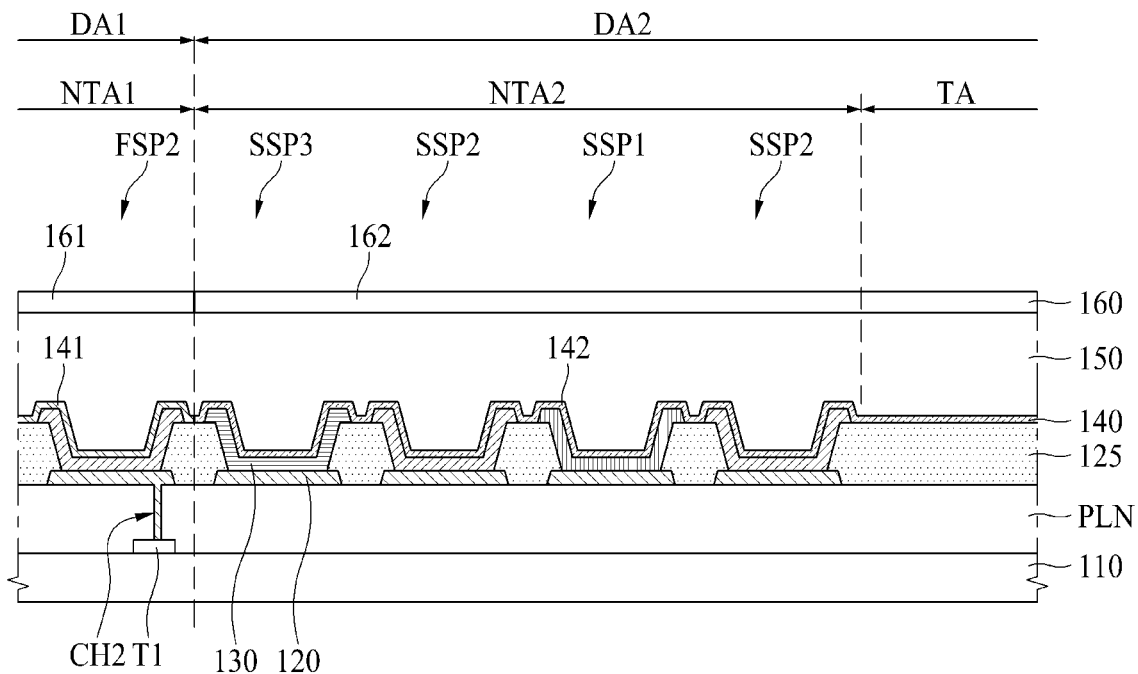
FIG. 12 is a cross-sectional view illustrating a modified example of a display panel according to one embodiment of the present disclosure.

FIG. 12 is a cross-sectional view illustrating a modified example of a display panel according to one embodiment of the present disclosure.

Referring to FIG. 12, the display panel 100 according to one embodiment of the present disclosure may further include a polarizer 160.

The polarizer 160 may be provided over the encapsulation film 150 to reduce reflection of externally incident light to the electrodes.

The polarizer 160 may include a polarizing portion 161 and a non-polarizing portion 162. The polarizing portion 161 may correspond to the first display area DA1, and may reduce reflection of externally incident light to the electrodes due to polarizing characteristic. The non-polarizing portion 162 corresponds to the second display area DA2, and has no polarizing characteristic. The non-polarizing portion A2 may be provided by detaching or bleaching a portion of the polarizer 160 using a chemical material.

In the display panel 100 according to one embodiment of the present disclosure, the non-polarizing portion 162 may be provided in the polarizer 160, whereby transmittance in the transmissive area TA of the second display area DA2 may not be reduced.

Meanwhile, if the polarizer 160 includes the polarizing portion 161 and the non-polarizing portion 162, the cathode electrode 140 may include a semi-transmissive electrode 141 and a transparent electrode 142. The semi-transmissive electrode 141 may be formed of a semi-transmissive conductive material such as Mg, Ag, or alloy of Mg and Ag. The transparent electrode 142 may be provided in the second display area DA2, and may be formed of a transparent conductive material (TCO) such as ITO and IZO, which can transmit light.

Figure 13:
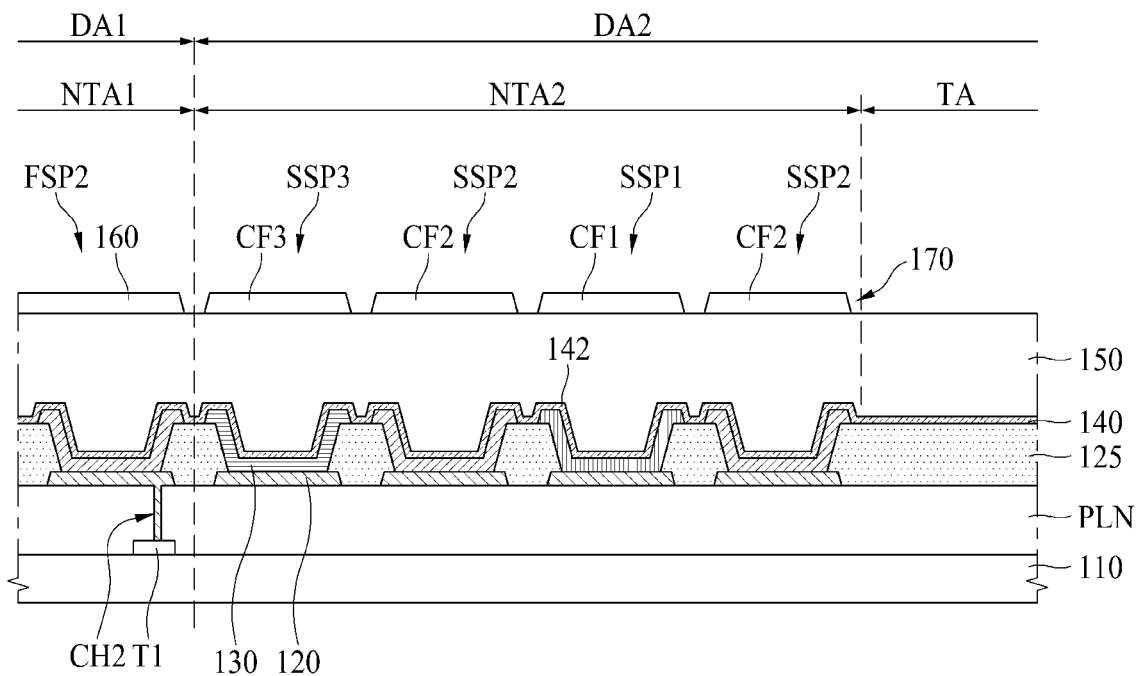
FIG. 13 is a cross-sectional view illustrating another modified example of a display panel according to one embodiment of the present disclosure.
Figure 14:
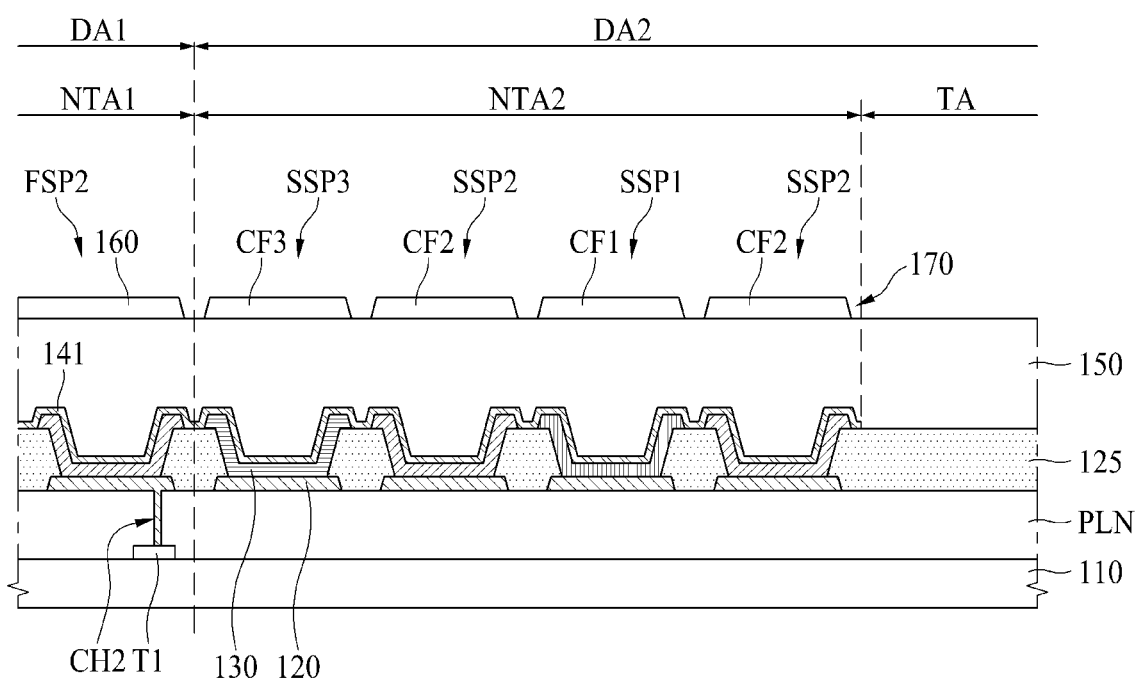
FIG. 14 is a cross-sectional view illustrating other modified example of a display panel according to one embodiment of the present disclosure.

FIG. 13 is a cross-sectional view illustrating another modified example of a display panel according to one embodiment of the present disclosure, and FIG. 14 is a cross-sectional view illustrating other modified example of a display panel according to one embodiment of the present disclosure.

Referring to FIG. 13, the display panel 110 according to one embodiment of the present disclosure may further include a polarizer 160 and a color filter layer 170.

The polarizer 160 may be provided over the encapsulation film 150 to correspond to the first display area DA1.

The color filter layer 170 may be provided over the encapsulation film 150 to correspond to the second display area DA2. The color filter layer 170 may be provided to be patterned for each of the first color subpixels FSP1 and SSP1, the second color subpixels FSP2 and SSP2 and the third color subpixels FSP3 and SSP3.

In detail, the color filter layer 170 may include a first color filter CF1, a second color filter CF2, and a third color filter CF3. The first color filter CF1 may be disposed to correspond to the light emission area of the first color subpixels FSP1 and SSP1, and may be a red color filter that transmits red light. The second color filter CF2 may be disposed to correspond to the light emission area of the second color subpixels FSP2 and SSP2, and may be a green color filter that transmits green light. The third color filter CF3 may be disposed to correspond to the light emission area of the third color subpixels FSP3 and SSP3, and may be a blue color filter that transmits blue light.

If the polarizer 160 is provided in the second display area DA2 of the display panel 100, light transmittance in the second display area DA2 is reduced by the polarizer 160. Meanwhile, if the polarizer 160 is not provided in the second display area DA2 of the display panel 100, a problem may occur in that externally incident light is reflected towards the electrodes provided in the second display area DA2.

In the display panel 100 according to one embodiment of the present disclosure, the polarizer 160 may be provided in only the first display area DA1, and the polarizer may not be provided in the second display area DA2. Also, in the display panel 100 according to one embodiment of the present disclosure, the color filter layer 170 may be provided in the second display area DA2.

In the display panel 100 according to one embodiment of the present disclosure, since the polarizer 160 is not provided in the second display area DA2, transmittance in the second display area DA2 is not reduced. Also, in the display panel 100 according to one embodiment of the present disclosure, the color filter layer 170 may be provided to absorb some of externally incident light, thereby reducing reflection of the incident light toward the electrodes. That is, in the display panel 100 according to one embodiment of the present disclosure, transmittance in the second display area DA2 may not be reduced and external light reflectance may be reduced.

Meanwhile, the cathode electrode 140 may include the semi-transmissive electrode 141 and the transparent electrode 142. The semi-transmissive electrode 141 may be provided in the first display area DA1, and may be formed of a semi-transmissive conductive material such as Mg, Ag, or alloy of Mg and Ag. The transparent electrode 142 may be provided in the second display area DA2, and may be formed of a transparent conductive material (TCO) such as ITO and IZO, which can transmit light.

In the display panel 100 according to one embodiment of the present disclosure, the semi-transmissive electrode 141 may be provided in the first display area DA1, whereby emission efficiency may be enhanced by micro cavity in the first display area DA1.

Also, in the display panel 100 according to one embodiment of the present disclosure, the transparent electrode 142 may be provided in the second display area DA2, whereby light transmittance in the second display area DA2 may be improved.

Meanwhile, FIGS. 12 and 13 show that the cathode electrode 140 is provided in all of the first display area DA1 and the second display area DA2, the present disclosure is not limited to the examples of FIGS. 12 and 13.

In another embodiment, as shown in FIG. 14, the cathode electrode 140 may include an opening area OA corresponding to the transmissive area TA of the second display area DA2. Therefore, the display panel 100 according to one embodiment of the present disclosure may have light transmittance higher than that of the transmissive area TA of the second display area DA2.

The display device according to the preferred embodiments of the present disclosure may be applied to various products such as a television, a notebook computer, a monitor, a refrigerator, a microwave oven, a washing machine, and a camera as well as portable electronic devices such as an electronic diary, an electronic book, a portable multimedia player (PMP), a navigator, an Ultra Mobile PC (UMPC), a smart phone, a mobile communication terminal, a mobile phone, a tablet personal computer (PC), a smart watch, a watch phone, or a wearable device.

It will be apparent to those skilled in the art that the present disclosure described above is not limited by the above-described embodiments and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:
1. A display device comprising:
    a substrate provided with a display area including a first display area and a second display area, the first display area including a plurality of first non-transmissive areas without any transmissive areas, and the second display area including a plurality of second non-transmissive areas and a plurality of transmissive areas;
    a first transistor provided in the first display area over the substrate;
    a second transistor provided in the second display area over the substrate, the second transistor including a gate electrode, a source electrode and a drain electrode;
    a first subpixel in the first display area and supplied with a power source from the first transistor;
    a second subpixel in the second display area and connected to the second transistor, the second subpixel including an anode electrode, an organic light emitting layer and a cathode electrode; and
    a plurality of signal lines connected with the second transistor, the plurality of signal lines including a plurality of data lines that transmit a data signal supplied from a data driver to the second subpixel,
    wherein the second subpixel includes at least two or more first color subpixels emitting light of a first color, and a second color subpixel emitting light of a second color,
    wherein the at least two or more first color subpixels in the second display area share the second transistor, wherein anode electrodes of the at least two or more first color subpixels in the second display area are electrically connected to each other via an anode connection line, wherein the anode connection line is provided on a same layer as at least one of the gate electrode, the source electrode, the drain electrode, and the anode electrode, wherein the anode connection line includes a first portion that extends in a first direction in a plan view of the display device and a second portion that extends in a second direction perpendicular to the first direction in the plan view, and wherein at least a part of the first portion of the anode connection line that electrically connects the anode electrodes of the at least two or more first color subpixels overlaps with the second color subpixel in the plan view of the display device and the second portion of the anode connection line that electrically connects the anode electrodes of the at least two or more first color subpixels does not overlap with the first and the second color subpixels included in the second subpixel in the plan view of the display device.

2. The display device of claim 1, wherein the second transistor is provided in only the second non-transmissive area in the second display area.

3. The display device of claim 1, wherein the plurality of signal lines are provided in only the second non-transmissive area in the second display area.

4. The display device of claim 1, wherein the second subpixel has a same size as that of the first subpixel.

5. The display device of claim 1, wherein a number of second subpixels provided in a unit area is different from a number of first subpixels provided in the unit area.

6. The display device of claim 5, wherein the number of second subpixels provided in the unit area is smaller than the number of first subpixels provided in the unit area.

7. The display device of claim 1, wherein the first subpixel includes a first color subpixel emitting light of the first color, and a second color subpixel emitting light of the second color, and a ratio of the second color subpixel to the first color subpixel in the first display area is the same as a ratio of the second color subpixel to the first color subpixel in the second display area.

8. A display device comprising:
a display panel including a first display area and a second display area, the display panel comprising:
transistors in the second display area, each transistor including a gate electrode, a source electrode, and a drain electrode;
a subpixel in the second display area, the subpixel supplied with a power source from the transistors, the subpixel including an anode electrode, an organic light emitting layer and a cathode electrode; and
a plurality of signal lines connected with the transistors, the plurality of signal lines including a plurality of data lines for transmitting a data signal supplied from a data driver to the subpixel,
wherein the subpixel includes at least two or more first color subpixels emitting light of a first color, and at least two or more second color subpixels emitting light of a second color,
wherein the at least two or more first color subpixels in the second display area share one of the transistors,
wherein the at least two or more second color subpixels share another one of the transistors,
wherein anode electrodes of the at least two or more first color subpixels are electrically connected to each other via a first anode connection line,
wherein anode electrodes of the at least two or more second color subpixels are electrically connected to each other via a second anode connection line,
wherein the first anode connection line and the second anode connection line are provided on a same layer as at least one of the gate electrode, the source electrode, the drain electrode, and the anode electrode,
wherein the first anode connection line includes a first portion that extends in a first direction in a plan view of the display device and a second portion that extends in a second direction perpendicular to the first direction in the plan view, and
wherein at least a part of the first portion of the first anode connection line that electrically connects the anode electrodes of the at least two or more first color subpixels overlaps with at least one of the at least two or more second color subpixels in the plan view of the display device and the second portion of the first anode connection line that electrically connects the anode electrodes of the at least two or more first color subpixels does not overlap with the first and second color subpixels in the plan view of the display device; and
a camera disposed below the display panel and provided to overlap the second display area,
wherein the second display area includes a plurality of transmissive areas, and a non-transmissive area provided between the plurality of transmissive areas and provided with a light emission area.

9. The display device of claim 8, wherein the first display area has first light transmittance, and the second display area has second light transmittance that is greater than the first light transmittance.

10. The display device of claim 8, wherein the second display area has a number of subpixels provided in a unit area, which is smaller than a number of subpixels in the first display area.

11. The display device of claim 8, wherein the subpixel provided in the second display area has a same size as that of a subpixel provided in the first display area.

12. The display device of claim 8, wherein the first display area includes a first color subpixel emitting light of the first color and a second color subpixel emitting light of the second color, and a ratio of the second color subpixel to the first color subpixel in first display area is the same as a ratio of the second color subpixel to the first color subpixel in the second display area.

13. The display device of claim 8, further comprising:
a plurality of first subpixels disposed in the first display area;
a first transistor disposed to correspond to each of the plurality of first subpixels.

* * * * *